United States Patent
Sawa

(10) Patent No.: US 11,029,356 B2
(45) Date of Patent: Jun. 8, 2021

(54) METHOD OF TESTING SEMICONDUCTOR DEVICE

(71) Applicant: FUJI ELECTRIC CO., LTD., Kawasaki (JP)

(72) Inventor: Yuki Sawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 2 days.

(21) Appl. No.: 16/773,404

(22) Filed: Jan. 27, 2020

(65) Prior Publication Data

US 2020/0284835 A1 Sep. 10, 2020

(30) Foreign Application Priority Data

Mar. 7, 2019 (JP) .............................. JP2019-042044

(51) Int. Cl.
  *G01R 31/28* (2006.01)
  *H01L 29/861* (2006.01)
  *H01L 29/739* (2006.01)

(52) U.S. Cl.
  CPC ..... *G01R 31/2891* (2013.01); *G01R 31/2872* (2013.01); *H01L 29/7393* (2013.01); *H01L 29/861* (2013.01)

(58) Field of Classification Search
  CPC .............. G01R 31/2608; G01R 31/261; G01R 31/2612; G01R 31/2614; G01R 31/2616; G01R 31/2617; G01R 31/2619
  See application file for complete search history.

(56) References Cited

U.S. PATENT DOCUMENTS

| | | | | |
|---|---|---|---|---|
| 8,338,758 | B2 * | 12/2012 | Kita ....................... | G01S 19/02 219/490 |
| 2015/0003492 | A1 * | 1/2015 | Miyanagi ................ | H01L 23/34 374/44 |
| 2016/0252571 | A1 * | 9/2016 | Iwahashi ................ | H01L 22/20 324/750.03 |

FOREIGN PATENT DOCUMENTS

| | | |
|---|---|---|
| JP | 2006-234403 A | 9/2006 |
| JP | 2006-337247 A | 12/2006 |
| JP | 2011-174946 A | 9/2011 |

* cited by examiner

*Primary Examiner* — Tung X Nguyen
(74) *Attorney, Agent, or Firm* — Rabin & Berdo, P.C.

(57) ABSTRACT

A first relational expression for a temperature of a semiconductor device and forward voltage of a temperature measurement diode is obtained in advance. A second relational expression is obtained in advance for ON voltage of the semiconductor device and an amount of temperature change from a first time point before ON of the semiconductor device until a second time point after OFF of the semiconductor device. An amount of forward voltage change of the temperature measurement diode from the first time point until the second time point is obtained. Next, the amount of temperature change from the first time point until the time second point is calculated using the first relational expression and the amount of forward voltage change. An ON voltage of the MOS gate semiconductor device after correction for the calculated amount of temperature change is obtained using the second relational expression.

11 Claims, 8 Drawing Sheets

METHOD OF TESTING SEMICONDUCTOR DEVICE

CROSS REFERENCE TO RELATED APPLICATIONS

This application is based upon and claims the benefit of priority of the prior Japanese Patent Application No. 2019-042044, filed on Mar. 7, 2019, the entire contents of which are incorporated herein by reference.

BACKGROUND OF THE INVENTION

1. Field of the Invention

Embodiments of the invention relate to a method of testing a semiconductor device.

2. Description of the Related Art

A conventional method of testing a semiconductor device will be described. FIGS. 12 and 13 are schematic cross-sectional views of a portion of a testing apparatus of a conventional semiconductor device. FIGS. 12 and 13 depict a structure near a stage 102 of a testing apparatus 110 of a conventional semiconductor device. FIGS. 12 and 13 are FIGS. 10 and 1 of Japanese Laid-Open Patent Publication No. 2011-174946 and Japanese Laid-Open Patent Publication No. 2006-337247, respectively. As depicted in FIG. 12, in a conventional method of testing a semiconductor device, a semiconductor chip 101 on which the semiconductor device is formed is placed on the stage 102 so that a back surface faces toward the stage 102 of the testing apparatus 110.

Subsequently, the stage 102 is moved vertically upward, a main electrode (not depicted) and a gate electrode (not depicted) provided at a front surface of the semiconductor chip 101 are pushed by a predetermined pressure to contact and thereby, be electrically connected to probe needles 103, 103' that are metal contacts positioned above the stage 102. Thereafter, electrical characteristics of the semiconductor device are measured by applying voltage to or passing current through the main electrode and the gate electrode of the semiconductor chip 101 via the probe needles 103, 103' under respectively corresponding predetermined conditions (for example, refer to Japanese Laid-Open Patent Publication No. 2011-174946, Japanese Laid-Open Patent Publication No. 2006-337247).

Further, in Japanese Laid-Open Patent Publication No. 2011-174946 and Japanese Laid-Open Patent Publication No. 2006-337247, as another method of testing a semiconductor device, a method is disclosed in which an electrode pad 111 formed by bonding metal fibers in a non-woven shape is used as the metal contact of a testing apparatus 110' instead of the probe needles 103, (FIG. 13). In particular, in the conventional method of testing the semiconductor device depicted in FIG. 13, the semiconductor chip 101 is placed on the first electrode pad 111 that is on the stage 102 of the testing apparatus 110' and the main electrode (not depicted) provided on the back surface of the semiconductor chip 101 is put into contact with and electrically connected to the first electrode pad 111.

Subsequently, the stage 102 is moved vertically upward, the main electrode (not depicted) and the gate electrode (not depicted) provided at the front surface of the semiconductor chip 101 are pushed by a predetermined pressure to contact and thereby, be electrically connected to a second electrode pad 112 positioned above the stage 102 and the probe needle 103', respectively. Electrical characteristics of the semiconductor device are measured by applying voltage to or passing current through the main electrode and the gate electrode of the semiconductor chip under respectively corresponding predetermined conditions via the first and the second electrode pads 111, 112 and the probe needle 103'.

The first and the second electrode pads 111, 112 of the testing apparatus 110' are electrode pads formed by metal fibers in a non-woven shape. As a result, a mathematical contact area between the main electrode of the semiconductor chip 101 and the first and the second electrode pads 111, 112 of the testing apparatus 110' increases, whereby contact resistance between the main electrode of the semiconductor chip 101 and the first and the second electrode pads 111, 112 of the testing apparatus 110' decreases. As a result, in a test in which large current is passed through the main electrode of the semiconductor chip 101, Joule heating caused by the large current flowing through the contact resistance may be suppressed.

Further, by using electrode pads formed by metal fibers in a non-woven shape as the first and the second electrode pads 111, 112 of the testing apparatus 110', damage to the first and the second electrode pads 111, 112 and the main electrode of the semiconductor chip 101 is mitigated. Further, mitigating the damage to the first and the second electrode pads 111, 112 enables the number maintenance sessions of the testing apparatus 110' to be reduced and enables continuous testing. Reference numeral 104 is an assembly that fixes the probe needles 103, 103', the second electrode pad 112, etc. Reference numeral 105 is a member to which the assembly 104 is mounted.

Further, as another conventional method of testing a semiconductor device, a method has been proposed in which degradation of characteristics (decreased current, thermal fluctuations) in measurement results of current-voltage characteristics of the semiconductor device due to self-specific heat effects are taken into consideration to obtain true current-voltage characteristics of a state without self-specific heat effects and the true current-voltage characteristics are used to extract parasitic resistance of an impurity region that is a simulation program with integrated circuit emphasis (SPICE) parameter of the semiconductor device (for example, refer to Japanese Laid-Open Patent Publication No. 2006-234403).

SUMMARY OF THE INVENTION

A method of testing a semiconductor device by applying voltage to or passing current through the semiconductor device under predetermined conditions to measure a first physical quantity, includes in a first process, obtaining a first relational expression representing a relationship between a temperature of the semiconductor device and a second physical quantity different from the first physical quantity, the temperature of the semiconductor device being measured using temperature characteristics of a diode, the second physical quantity changing dependent on the temperature of the semiconductor device; in a second process, obtaining a second relational expression representing a relationship between the first physical quantity of the semiconductor device and an amount of change of the temperature of the semiconductor device, among a plurality of measurement points, each of which has a first variable value and a second variable value, the first variable value being a measured value of the first physical quantity that changes dependent on the temperature of the semiconductor device in a measurement period, the second variable value being measured by the diode as an amount of change of the temperature during a switching period within the measurement period of the first physical quantity, the switching period starting when the semiconductor device is turned ON and ending when the semiconductor device is turned OFF; in a third process, obtaining an amount of change of the second physical quantity during the switching period by measuring the second physical quantity simultaneously with the semiconductor device being turned OFF or immediately after the semiconductor device being turned OFF after the switching period; in a fourth process, obtaining, based on the first relational expression and the amount of change of the second physical quantity obtained in the third process, the amount of change of the temperature of the semiconductor device during the switching period; and in a fifth process, obtaining, based on the second relational expression, a corrected first physical quantity by correcting the first physical quantity according to the amount of change of the temperature of the semiconductor device obtained in the fourth process.

In the embodiment, in the third process, the amount of change of the second physical quantity during the switching period is obtained as an amount of change from a pre-second physical quantity to a post-second physical quantity, the pre-second physical quantity being obtained before the semiconductor device is turned ON before the switching period, the post-second physical quantity being obtained simultaneously with or immediately after the semiconductor device is turned OFF after the switching period.

In the embodiment, the second relational expression is a primary approximate line calculated by approximating all of the plurality of measurement points on a single straight line. In the fifth process, a first variable value of a data point on an auxiliary straight line that is parallel to the primary approximate line and passes through a predetermined point among the plurality of measurement points is obtained as the corrected first physical quantity and corresponds to the amount of change of the temperature of the semiconductor device obtained in the fourth process.

In the embodiment, a testing apparatus is used for the testing the semiconductor device that is formed on a first main surface of a semiconductor substrate, the testing apparatus including: a stage on which the semiconductor substrate is placed; and a metal contact that, in a state where a second main surface opposite to the first main surface of the semiconductor substrate is in contact with the stage, applies voltage to or passes current through the semiconductor device, from the first main surface under the predetermined conditions.

In the embodiment, the semiconductor device and the diode are formed on the semiconductor substrate.

In the embodiment, the semiconductor device is an insulated gate bipolar transistor, and the diode is a parasitic diode formed by a pn junction between a collector region and a drift region of the insulated gate bipolar transistor.

In the embodiment, the diode is constituted by a part of the semiconductor device.

In the embodiment, the second physical quantity is a forward voltage of the diode.

In the embodiment, the semiconductor device is an insulated gate semiconductor device including an insulated gate formed by a three-layer structure including a metal, an oxide film, and a semiconductor material, and the second physical quantity is a gate threshold voltage of the semiconductor device.

In the embodiment, the first physical quantity is a voltage when the semiconductor device is turned ON.

In the embodiment, the first physical quantity is a leak current that flows through the semiconductor device when the semiconductor device is turned ON.

Objects, features, and advantages of the present invention are specifically set forth in or will become apparent from the following detailed description of the invention when read in conjunction with the accompanying drawings.

DETAILED DESCRIPTION OF THE INVENTION

Figure 12:
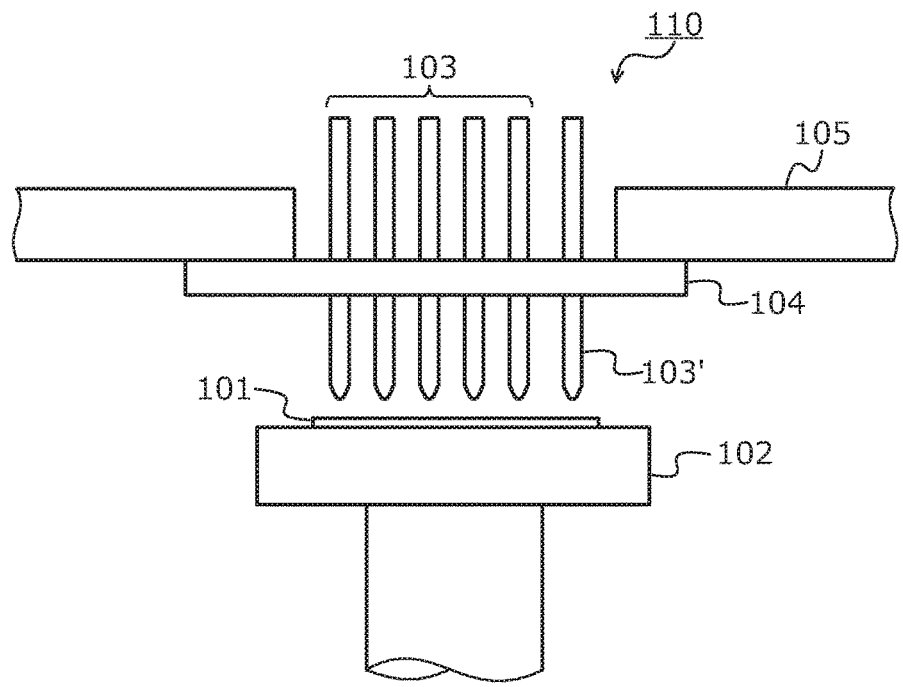
FIG. 12 is a schematic cross-sectional view of a portion of a testing apparatus of a conventional semiconductor device.
Figure 13:
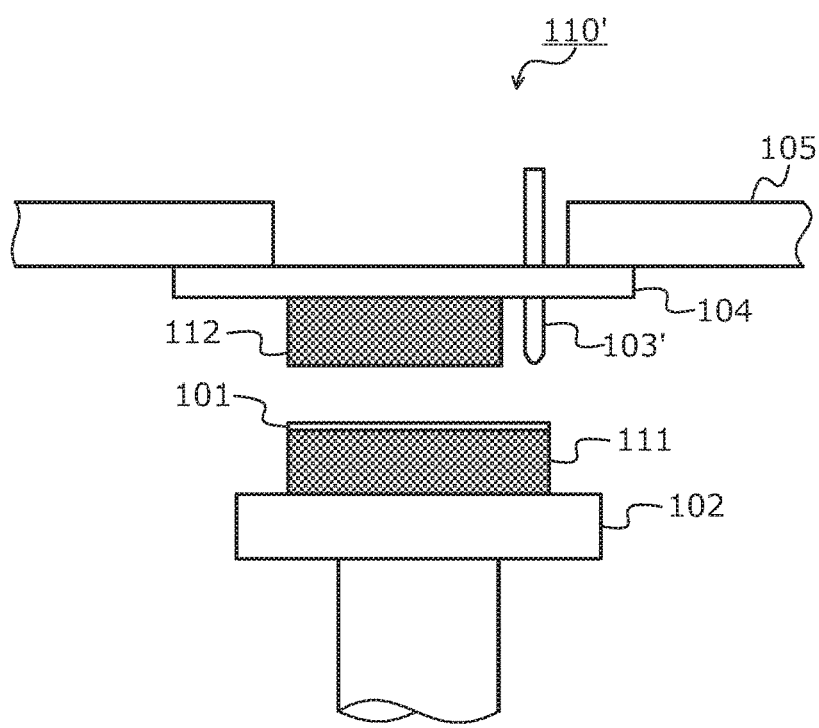
FIG. 13 is a schematic cross-sectional view of a portion of a testing apparatus of a conventional semiconductor device.

First, problems associated with the conventional techniques will be discussed. In the conventional testing apparatus 110' depicted in FIG. 13, as described above, a main electrode (hereinafter, back electrode) provided on the back surface of the semiconductor chip 101 is in contact with the first electrode pad 111 of the stage 102. Therefore, as compared to a case in which the conventional testing apparatus 110 depicted in FIG. 12 is used, the contact resistance between the back electrode of the semiconductor chip 101 and the stage 102 of the testing apparatus 110' is reduced. As a result, thermal contact resistance between the back electrode of the semiconductor chip 101 and the stage 102 of the testing apparatus 110' is also presumed to decrease.

Nonetheless, in Japanese Laid-Open Patent Publication No. 2011-174946 and Japanese Laid-Open Patent Publication No. 2006-337247, there is no mention of adverse effects inflicted on the contact resistance between the back electrode of the semiconductor chip 101 and the stage 102 of the testing apparatus 110' by generated heat and thermal contact resistance. The thermal contact resistance is thermal resistance occurring at an interface (contact surface) between two bodies. When the thermal contact resistance between two bodies increases, heat flow between the two bodies is less likely to occur. Therefore, when thermal contact resistance between the back electrode of the semiconductor chip 101 and the stage 102 of the testing apparatus 110' increases, heat dissipation of the semiconductor chip 101 degrades.

Degradation of the heat dissipation of the semiconductor chip 101 advances as thermal contact resistance between the back electrode of the semiconductor chip 101 and the stage 102 of the testing apparatus 110' increases. In a test performed by passing a large current through the semiconductor device, such as, for example, when measuring ON voltage, temperature increases of the semiconductor chip 101 due to heat generated by the semiconductor device advance as the measurement current increases and thus, adverse effects on measurement results due to degradation of the heat dissipation of the semiconductor chip 101 cannot be ignored. Therefore, among the semiconductor chips 101, measurement variations due to variation of thermal contact resistance may be large.

Embodiments of a method of testing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

During a test in which electrical characteristics of a semiconductor device are measured, when the electrical characteristics that are to be measured vary dependent on the temperature of the semiconductor device, attached to variation of the measured electrical characteristics are characteristics variation of the semiconductor devices as a manufactured product and measurement variation (hereinafter, measurement variation due to self-generated heat of the semiconductor devices) occurring due to temperature increases of the semiconductor chips on which are formed the semiconductor devices whose self-generated heat causes the temperature increases. When among the semiconductor chips, variation of thermal contact resistance between the semiconductor chip and the stage of the testing apparatus is large, the measurement variation due to self-generated heat of the semiconductor devices differs according to semiconductor chip and therefore, measurement variation among the semiconductor chips 101 increases.

Thus, measurement variation due to self-generated heat of the semiconductor devices is removed from the variation of electrical characteristics of the semiconductor device measured using a typical testing apparatus, and the measured electrical characteristics of the semiconductor device (measured values) are corrected to the electrical characteristics of the semiconductor device for a predetermined amount of temperature change. Here, it was found that correction of the measured value based on a relationship between a physical quantity that varies dependent on the temperature of the semiconductor device and the temperature of the semiconductor device enabled measurement variation among the semiconductor chips to be suppressed and measurement accuracy of the electrical characteristics of the semiconductor devices to be enhanced. The present invention was made based on knowledge such as that below.

A method of testing a semiconductor device according to a first embodiment is a method of testing in which electrical characteristics of a diode or a MOS gate semiconductor device having an insulated gate formed by a 3-layer structure including a metal, an oxide film, and a semiconductor material are measured. A MOS gate semiconductor device to which the method of testing a semiconductor device according to the first embodiment is applicable may be that including a general MOS gate structure while a diode may be a general diode formed by a pn junction between p-type region and an n-type region in a semiconductor chip. Therefore, an internal structure of the semiconductor chip of the semiconductor device according to the first embodiment will not be described herein.

Figure 1:
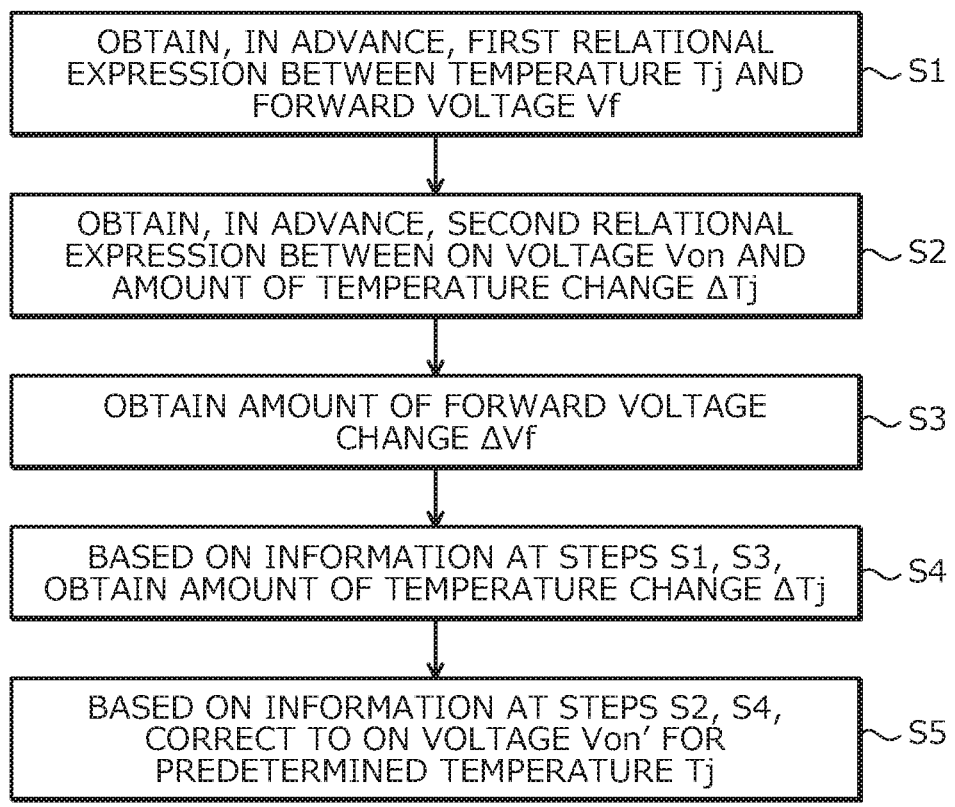
FIG. 1 is a flowchart of an outline of a method of testing a semiconductor device according to a first embodiment.
Figure 2A:
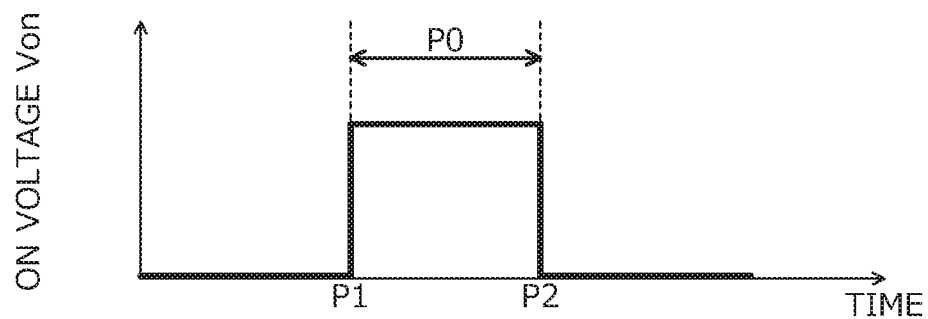
FIG. 2A is a characteristics diagram depicting temporal changes of ON voltage of the semiconductor device according to the first embodiment.
Figure 2B:
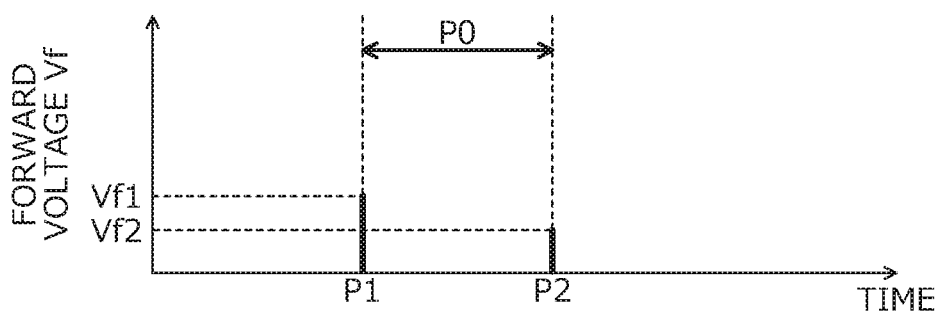
FIG. 2B is a characteristics diagram depicting temporal change of forward voltage of a temperature measurement diode.
Figure 2C:
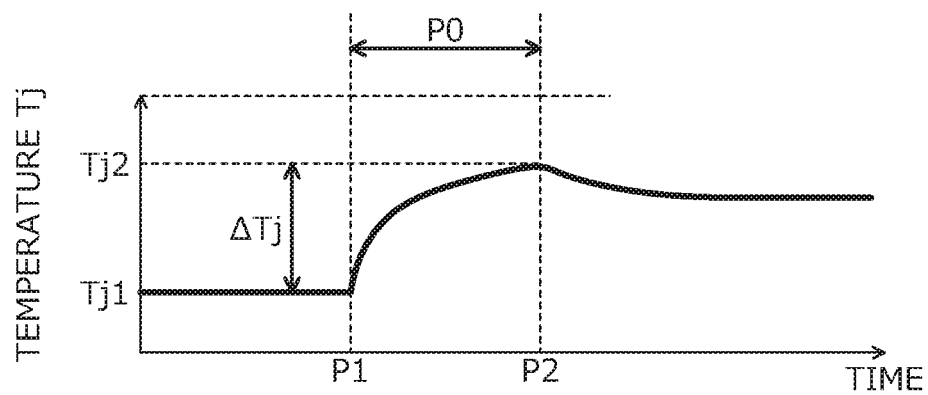
FIG. 2C is a characteristics diagram depicting temporal changes of temperature of the semiconductor device according to the first embodiment.

The method of testing a semiconductor device according to the first embodiment will be described with reference to FIGS. 1 to 6, 12, and 13. FIG. 1 is a flowchart of an outline of the method of testing a semiconductor device according to the first embodiment. FIGS. 2A and 2C are characteristics diagrams depicting temporal changes of ON voltage and temperature of the semiconductor device according to the first embodiment. FIGS. 2A, 2B, and 2C depict temporal changes of the semiconductor device according to the first embodiment, including temporal change of the ON voltage Von (FIG. 2A), temporal change of forward voltage Vf (second physical quantity) of a temperature measurement diode (temperature sensing diode) (FIG. 2B), and temporal change of a temperature Tj of the semiconductor device according to the first embodiment (FIG. 2C).

Figure 3:
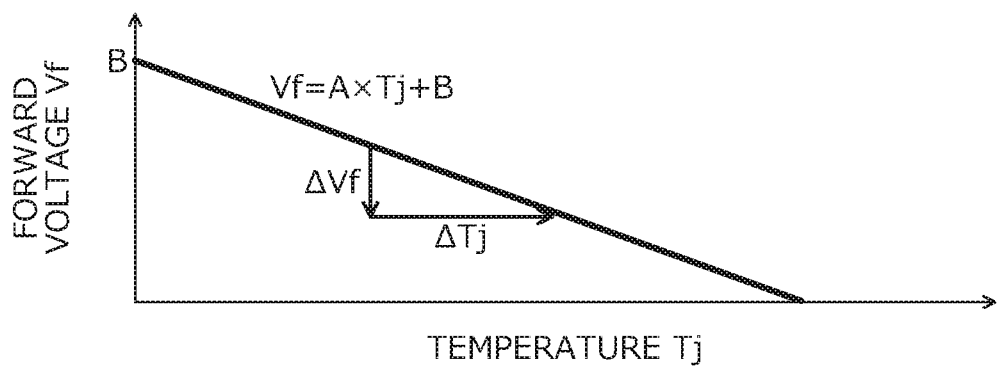
FIG. 3 is a characteristics diagram depicting temperature dependence of forward voltage of the temperature measurement diode.
Figure 4:
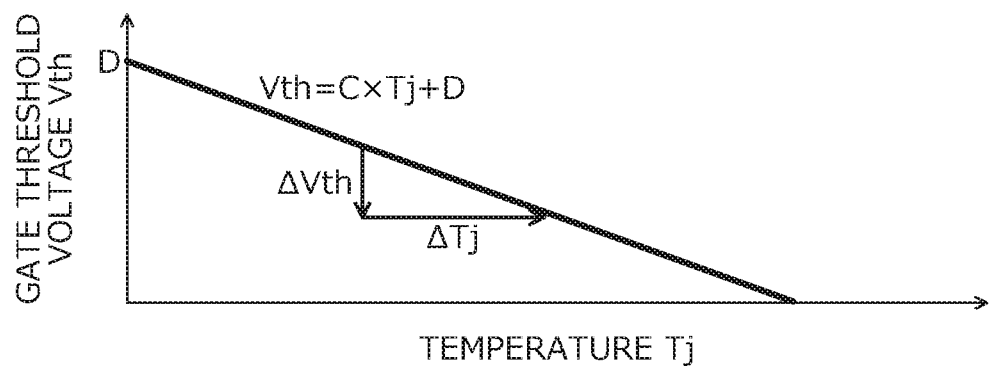
FIG. 4 is a characteristics diagram depicting temperature dependence of a gate threshold voltage of the semiconductor device according to the first embodiment.

FIG. 3 is a characteristics diagram depicting temperature dependence of the forward voltage Vf of the temperature measurement diode. FIG. 4 is a characteristics diagram depicting temperature dependence of a gate threshold voltage of the semiconductor device according to the first embodiment. In FIGS. 3 and 4, a horizontal axis is the temperature (temperature of the semiconductor chip 101) Tj of the semiconductor device according to the first embodiment. The temperature Tj of the semiconductor device according to the first embodiment is measured by the temperature measurement diode. In FIGS. 3 and 4, vertical axes are the forward voltage Vf of the temperature measurement diode and a gate threshold voltage Vth of the semiconductor device according to the first embodiment, respectively.

Figure 5:
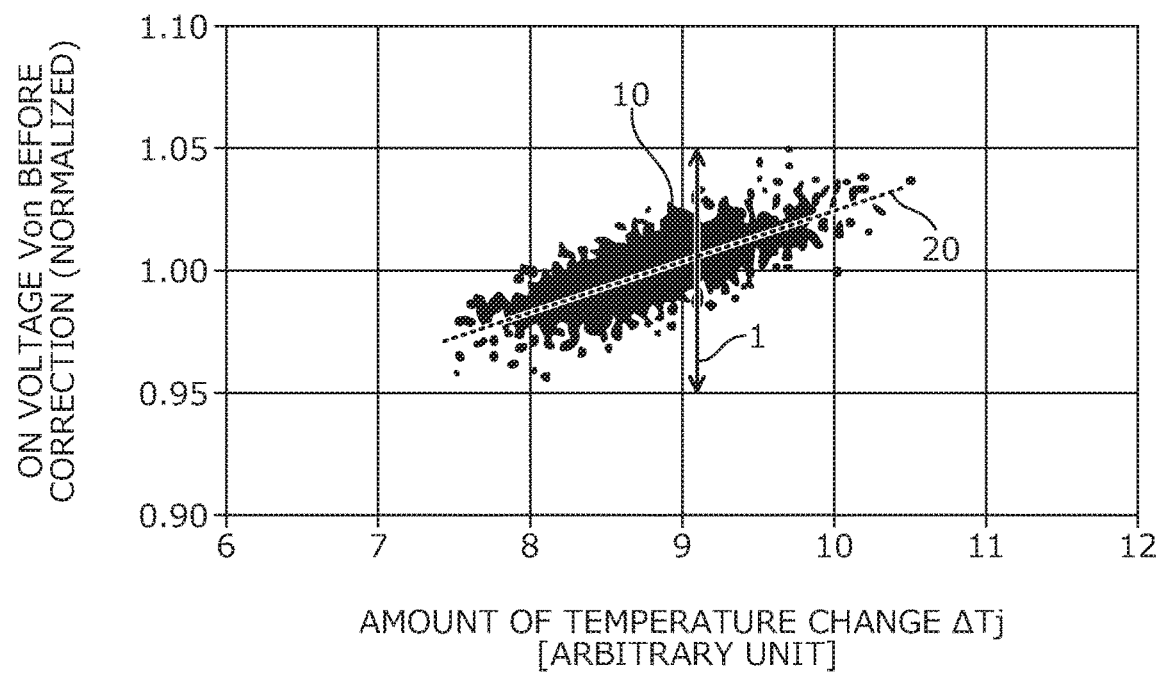
FIG. 5 is a characteristics diagram depicting temperature change dependence of the ON voltage before correction of the semiconductor device according to the first embodiment.
Figure 6:
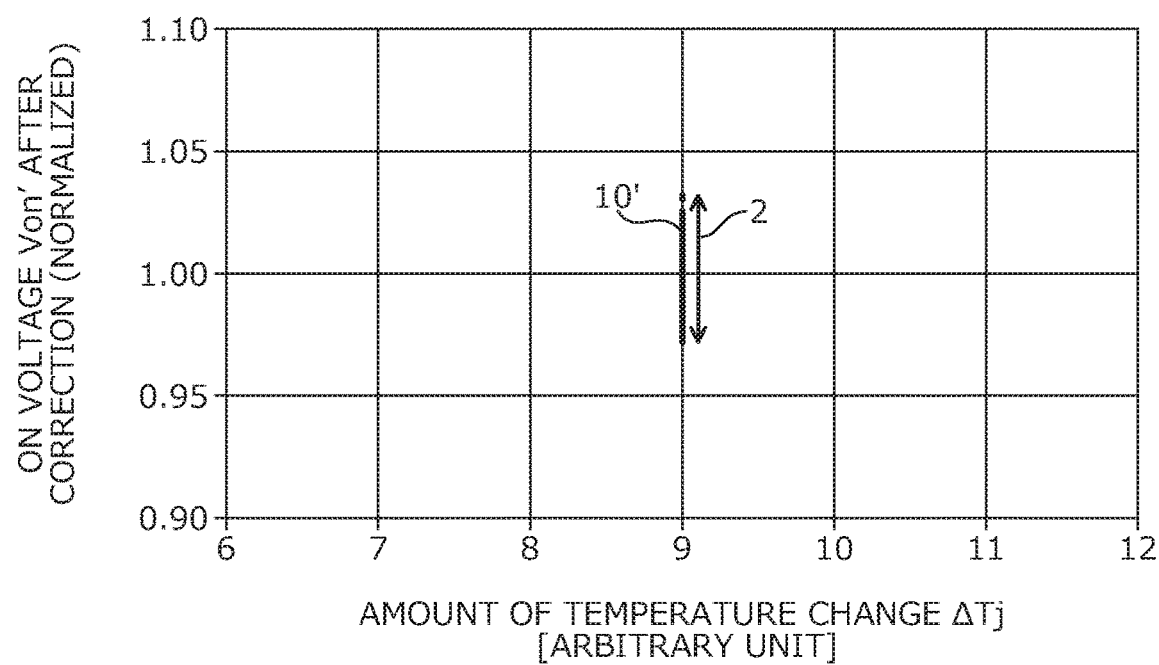
FIG. 6 is a characteristics diagram depicting temperature change dependence of the ON voltage after correction of the semiconductor device according to the first embodiment.

FIGS. 5 and 6 are characteristics diagrams depicting temperature change dependence of the ON voltage before and after correction of the semiconductor device according to the first embodiment, respectively. In FIG. 5, a horizontal axis and a vertical axis are respectively an amount of temperature change ΔTj and the ON voltage Von before correction for the semiconductor device according to the first embodiment. FIG. 5 depicts measured values of the ON voltage Von of the semiconductor device according to the first embodiment. In FIG. 6, a horizontal axis and a vertical axis are respectively the amount of temperature change ΔTj and the ON voltage Von' (corrected first physical quantity) after correction for the semiconductor device according to the first embodiment. FIG. 6 depicts the measured values of the ON voltage Von of the semiconductor device according to the first embodiment in FIG. 5, corrected based on the predetermined amount of temperature change ΔTj.

In the method of testing a semiconductor device according to the first embodiment, the semiconductor chip 101 and the testing apparatuses 110, 110' (FIGS. 12 and 13) representative of and similar to those of the conventional techniques may be used and therefore, description of configurations of the semiconductor chip 101 and the testing apparatuses 110, 110' will be omitted herein. Here, a case will be described in which the semiconductor device according to the first embodiment is a vertical MOS gate semiconductor device formed on the semiconductor chip 101 and at steps S1 to S4 described hereinafter, the testing apparatus 110 (FIG. 12) is used to obtain various characteristics of the semiconductor chip 101 and correct the ON voltage Von (first physical quantity) that varies dependent on the temperature Tj of the MOS gate semiconductor device.

The main electrode (back electrode) provided on the semiconductor chip 101 is connected to the metal stage 102 of the testing apparatus 110 while the main electrode (hereinafter, front electrode) and the gate electrode provided on the front surface of the semiconductor chip 101 are connected to the different probe needles 103, 103', respectively. The various described characteristics are obtained by steps S1 to S4 described hereinafter by applying voltage to or passing current through the main electrode and the gate electrode of the semiconductor chip 101 under predetermined conditions via the probe needles 103, 103'. At this time, heat builds up in the semiconductor chip 101 caused by, for example, thermal contact resistance between the stage 102 of the testing apparatus 110 and the semiconductor chip 101.

First, a first relational expression between the temperature Tj of the MOS gate semiconductor device and the forward voltage Vf of the temperature measurement diode is obtained in advance (step S1: first process). In a process at step S1, as a manufactured product, heating of the semiconductor chip 101 (or another semiconductor chip of a similar configuration as that of the semiconductor chip 101 may be used; hereinafter, simply, the semiconductor chip 101), measuring of the predetermined temperature Tj of the MOS gate semiconductor device by the temperature measurement diode, and measuring of the forward voltage Vf of the temperature measurement diode during measurement of the predetermined temperature Tj is performed plural times.

Measurement points having the temperature Tj of the MOS gate semiconductor device and the forward voltage Vf of the temperature measurement diode as variables are obtained and using a set (hereinafter, measurement point group) of all the obtained measurement points, for example, an approximate line (first relational expression) with two variables including the temperature Tj of the MOS gate semiconductor device and the forward voltage Vf of the temperature measurement diode is calculated by a method of least-squares (FIG. 3). The approximate line is a linear function expressed by equation (1), where A is a slope and B is an intercept.

$$Vf = A \times Tj + B \quad (1)$$

The temperature measurement diode, for example, is mounted on the semiconductor chip 101 having the MOS gate semiconductor device. The temperature measurement diode has a function of detecting the temperature Tj of the MOS gate semiconductor device, using diode temperature characteristics. Instead of the forward voltage Vf of the temperature measurement diode, another physical quantity that varies dependent on the temperature Tj of the MOS gate semiconductor device may be measured and an approximate line with the temperature Tj of the MOS gate semiconductor device and this other physical quantity as variables may be calculated.

Calculation of the approximate line with the temperature Tj of the MOS gate semiconductor device and this other physical quantity as variables enables application of the present invention in cases in which the temperature measurement diode is not mounted on the semiconductor chip 101. When this other physical quantity, for example, is the gate threshold voltage Vth of the MOS gate semiconductor device, the first relational expression is expressed by equation (2), where C is the slope and D is the intercept (FIG. 4).

$$Vth = C \times Tj + D \quad (2)$$

In addition to the semiconductor device according to the first embodiment, the temperature measurement diode for measuring the temperature Tj of the semiconductor device according to the first embodiment is disposed on the semiconductor chip 101, thereby enabling the temperature Tj of the semiconductor device according to the first embodiment to be measured with favorable response speed to ON/OFF operation of the semiconductor device according to the first embodiment. When the semiconductor device according to the first embodiment is an insulated gate bipolar transistor (IGBT), a parasitic diode formed by a pn junction between a $p^+$-type collector region and an $n^-$-type drift region may be used as the temperature measurement diode.

Further, when the semiconductor device according to the first embodiment is a metal oxide semiconductor field effect transistor (MOSFET) including an insulated gate formed by a 3-layer structure including a metal, an oxide film, and a semiconductor material, a parasitic diode formed by a pn junction between a p-type base region and an $n^-$-type drift region of the MOSFET may be used as the temperature measurement diode. When the semiconductor device according to the first embodiment is a diode, the temperature Tj and the forward voltage Vf of the semiconductor device according to the first embodiment may be measured using temperature characteristics of the diode itself.

In this manner, in a case where a parasitic diode of the MOS gate semiconductor device is used as the temperature measurement diode or a case where temperature characteristics of a diode itself are used, as compared to, a case where in addition to the semiconductor device according to the first embodiment, the temperature measurement diode is disposed on the semiconductor chip 101, the temperature Tj and the forward voltage Vf of the semiconductor device according to the first embodiment may be measured by a low current value (for example, the current value immediately after a rise in the current). As a result, when the temperature Tj and the forward voltage Vf of the semiconductor device according to the first embodiment is measured, voltage-current (V-I) characteristics of the semiconductor device according to the first embodiment are not easily affected.

Next, the ON voltage Von of the MOS gate semiconductor device, a temperature Tj1 before the MOS gate semiconductor device turns ON, and a temperature Tj2 after the MOS gate semiconductor device turns OFF are measured. Subsequently, an approximate line 20 described hereinafter is obtained in advance as a second relational expression expressing a relationship between the ON voltage Von of the MOS gate semiconductor device and a difference (temperature increase, hereinafter, amount of temperature change) $\Delta Tj$ of the temperature Tj1 before the MOS gate semiconductor device turns ON and the temperature Tj2 after the MOS gate semiconductor device turns OFF (step S2: second process).

In particular, in a process at step S2, measurement of the ON voltage Von of the MOS gate semiconductor device and measurement of both the temperature Tj1 before the MOS gate semiconductor device turns ON and the temperature Tj2 after the MOS gate semiconductor device turns OFF, by the temperature measurement diode during measurement of the ON voltage Von as well as calculation of the amount of temperature change $\Delta Tj$ (=Tj2−Tj1) are performed plural times. In this manner, plural measurement points are obtained with the ON voltage Von of the MOS gate semiconductor device and the amount of temperature change $\Delta Tj$ of the MOS gate semiconductor device during measurement of the ON voltage Von as variables.

After the MOS gate semiconductor device transitions (switches) from OFF to ON, the temperature Tj of the MOS gate semiconductor device increases over time. Therefore, in the process at step S2, although a time point P1 before the MOS gate semiconductor device turns ON may be simultaneously with or immediately before (from a time point a few tens of ms (milliseconds) before simultaneous with turning ON to a time point less than simultaneous with turning ON) the MOS gate semiconductor device turns ON, while the MOS gate semiconductor device is completely OFF, the temperature Tj of the MOS gate semiconductor device is substantially constant and therefore, provided the time point P1 before the MOS gate semiconductor device turns ON is a time point of a complete OFF state of the MOS gate semiconductor device, the time point P1 may be a time point slightly before immediately before the MOS gate semiconductor device turns ON.

On the other hand, after the MOS gate semiconductor device transitions (switches) from ON to OFF, the temperature Tj of the MOS gate semiconductor device decreases over time. Therefore, in the process at step S2, although a time point P2 after the MOS gate semiconductor device turns OFF may be simultaneously with turning OFF of the MOS gate semiconductor device, the time point P2 may be at the latest, immediately thereafter (for example, from a time point exceeding simultaneous with turning OFF to a time point a few tens of ms after) because when the temperature Tj of the MOS gate semiconductor device is measured, the amount of temperature change $\Delta Tj$ of the MOS gate semiconductor device may be obtained more accurately the closer that the time point P2 after the MOS gate semiconductor device turns OFF is to being simultaneously with turning OFF of the MOS gate semiconductor device.

Turning ON of the MOS gate semiconductor device is a flow of drain-source current in the semiconductor chip 101 by an application of gate voltage at least equal to the gate threshold voltage to the gate electrode in a state in which positive voltage relative to the source electrode is applied to the drain electrode. Turning OFF of the MOS gate semiconductor device is interruption of the drain-source current flowing in the semiconductor chip 101 by an application of gate voltage less than the gate threshold voltage to the gate electrode in a state in which positive voltage relative to the source electrode is applied to the drain electrode.

All measurement points (measurement point group) 10 obtained in this manner are used and, for example, by a method of least-squares, the approximate line 20 having the ON voltage Von of the MOS gate semiconductor device and the amount of temperature change $\Delta Tj$ as two variables is calculated (FIG. 5). In FIG. 5, the horizontal axis represents, in an arbitrary unit, the amount of temperature change $\Delta Tj$ of the MOS gate semiconductor device. In FIG. 5, a vertical axis represents the ON voltage Von of the MOS gate semiconductor device before correction standardized using, as a standard (Von=1), an average value of Von before correction.

When the ON voltage Von at the time point P1 before the MOS gate semiconductor device turns ON is assumed to be 0V, the ON voltage Von at the time point P1 before the MOS gate semiconductor device turns ON needs not be measured.

The approximate line 20 having the amount of temperature change $\Delta Tj$ of the MOS gate semiconductor device and the ON voltage Von before correction as two variables is a linear function expressed by equation (3), where E is the slope and F is the intercept. In the example depicted in FIG. 5, measurement points of the measurement point group 10 are distributed with the ON voltage Von of the MOS gate semiconductor device before correction being within a range from about 0.95 to 1.05; a magnitude (standard deviation) σ of a variation 1 of the measurement points of the ON voltage Von before correction is about 0.014.

$$Von = E \times \Delta Tj + F \quad (3)$$

Appended to the approximate line 20 indicating the amount of temperature change characteristics for the ON voltage Von of the MOS gate semiconductor device before correction depicted in FIG. 5, is measurement variation of the ON voltage Von (hereinafter, measurement variation of the ON voltage Von due to self-generated heat of the MOS gate semiconductor device) in the characteristics variation of the ON voltage Von of the MOS gate semiconductor device as a manufactured product, caused by the amount of temperature change $\Delta Tj$ of the semiconductor chip 101 due to self-generated heat of the MOS gate semiconductor device. The processes up to here are preparation processes for obtaining information used at a subsequent process and therefore, the process at step S1 is performed before the process at step S4 and the process at step S2 is performed before the process at step S5.

In FIG. 5, the horizontal axis, instead of the amount of temperature change $\Delta Tj$ of the MOS gate semiconductor device, may be an amount of change of another physical quantity that varies dependent on the temperature Tj of the MOS gate semiconductor device. In particular, in FIG. 5, the horizontal axis may be an amount of change of the forward voltage Vf of the temperature measurement diode (hereinafter, amount of forward voltage change) $\Delta Vf$ before ON and after OFF of the MOS gate semiconductor device, or an amount of change of the gate threshold voltage Vth (hereinafter, amount of gate threshold voltage change) $\Delta Vth$ before ON and after OFF of the MOS gate semiconductor device.

In these cases, the process at step S1 is omitted and in the process at step S2, instead of the amount of temperature change $\Delta Tj$ of the MOS gate semiconductor device, the amount of forward voltage change $\Delta Vf$ (=Vf2−Vf1) of the temperature measurement diode, or the amount of gate threshold voltage change $\Delta Vth$ (=Vth2−Vth1) of the MOS gate semiconductor device is obtained. An approximate line calculated having the amount of change of a predetermined physical quantity of the MOS gate semiconductor device and the ON voltage Von before correction as two variables is a linear function in which in equation (3), $\Delta Tj$ is replaced with the amount of change of the predetermined physical quantity.

Next, forward voltages Vf1, Vf2 of the temperature measurement diode respectively at the time points P1, P2 before turn ON and after turn OFF of the MOS gate semiconductor device subject to measurement (FIG. 2B) are measured. Subsequently, the amount of forward voltage change $\Delta Vf$ (=Vf2−Vf1) of the temperature measurement diode from the time point P1 before the MOS gate semiconductor device turns ON to the time point P2 after the MOS gate semiconductor device turns OFF is obtained (step S3: third process). In the process at step S3, the time points P1, P2 before the MOS gate semiconductor device turns ON and after the MOS gate semiconductor device turns OFF when the forward voltage Vf of the temperature measurement diode is measured are at a same timing as the measurement of the temperature Tj of the MOS gate semiconductor device in the process at step S2 above.

A schematic diagram of temporal changes of the ON voltage Von of the MOS gate semiconductor device during the process at step S3 is depicted in FIG. 2A. ON voltage characteristics of the MOS gate semiconductor device depicted in FIG. 2A are ON voltage characteristics obtained by step S5 described hereinafter and is a schematic diagram of ON voltage characteristics in a state in which measurement variation of the ON voltage Von due to self-generated heat of the MOS gate semiconductor device has been removed.

In the process at step S3, regarding an interval P0 (=P2−P1) during which the ON state of the MOS gate semiconductor device is maintained, various modifications are possible by design conditions of the MOS gate semiconductor device and, for example, the interval P0 may be about a few μs (microseconds) to a few ms because when the interval P0 during which the MOS gate semiconductor device is in the ON state is too short, ON operation of the MOS gate semiconductor device is unstable. Further, when the interval P0 during which the MOS gate semiconductor device is in the ON state is too long, the temperature Tj of the MOS gate semiconductor device becomes too high.

Next, equation (1) is obtained by the process at step S1 and using the amount of forward voltage change $\Delta Vf$ of the temperature measurement diode obtained by the process at step S3, the amount of temperature change $\Delta Tj$ from the time point P1 before the MOS gate semiconductor device turns ON to the time point P2 after the MOS gate semiconductor device turns OFF is calculated (step S4: fourth process). In a process at step S4, the amount of temperature change $\Delta Tj$ corresponding to the amount of forward voltage change $\Delta Vf$ of the temperature measurement diode obtained by step S3 is calculated (FIG. 3). The amount of temperature change $\Delta Tj$ obtained by step S4 is an amount of temperature change that is a reference when the ON voltage Von of the MOS gate semiconductor device is corrected in a process at step S5 described hereinafter.

FIG. 2C is a schematic diagram of temporal changes of the temperature Tj during switching of the MOS gate semiconductor device, estimated based on equation (1) and equation (2) above. In FIGS. 2A to 2C, a case is depicted in which the time point P1 before the MOS gate semiconductor device turns ON is assumed to be a point simultaneous with the MOS gate semiconductor device turning ON and the time point P2 after the MOS gate semiconductor device turns OFF is assumed to be a point simultaneous with the MOS gate semiconductor device turning OFF. As depicted in FIG. 2C, prior to the time point P1, an OFF state of the MOS gate semiconductor device is maintained and the temperature Tj of the MOS gate semiconductor device, for example, is substantially stable at about 150 degrees C.

Further, the temperature Tj of the MOS gate semiconductor device increases over time from the time point P1 before the MOS gate semiconductor device turns ON; and at the time point P2 after the MOS gate semiconductor device turns OFF, the temperature Tj is highest at, for example, about 160 degrees C. The amount of temperature change $\Delta Tj$ (=10 degrees C.) between the time points P1, P2 before the MOS gate semiconductor device turns ON and after the MOS gate semiconductor device turns OFF corresponds to the amount of temperature change $\Delta Tj$ depicted in FIG. 3. Subsequently, from the time point P2 after the MOS gate semiconductor device turns OFF and thereafter, the temperature Tj of the MOS gate semiconductor device decreases over time.

At step S3, instead of the forward voltages Vf1, Vf2 of the temperature measurement diode, as another physical quantity dependent on the temperature Tj of the MOS gate semiconductor device, for example, the gate threshold voltages Vth1, Vth2 at the time points P1, P2 before the MOS gate semiconductor device turns ON and after the MOS gate semiconductor device turns OFF may each be measured. In this case, equation (2) obtained by the process at step S1 and the gate threshold voltages Vth1, Vth2 of the MOS gate semiconductor device obtained by the process at step S3 are used in the process at step S4.

Subsequently, the amount of temperature change $\Delta Tj$ indicated by the horizontal axis in FIG. 4 and corresponding to the amount of gate threshold voltage change $\Delta Vth$ (=Vth2−Vth1) of the MOS gate semiconductor device depicted on the vertical axis of FIG. 4 is calculated from the information obtained by the processes at steps S1, S3. In the process at step S4, even when any of the amount of forward voltage change $\Delta Vf$ of the temperature measurement diode and the amount of gate threshold voltage change $\Delta Vth$ of the MOS gate semiconductor device is used, provided configuration of the MOS gate semiconductor device is similar, the calculated amount of temperature change $\Delta Tj$ is substantially a similar result.

In a case in which the ON voltage Von at the time point P1 before the MOS gate semiconductor device turns ON is assumed to be 0V, in the process at step S3 described above, the forward voltage Vf of the temperature measurement diode at the time point P1 before the MOS gate semiconductor device turns ON needs not be measured. In this case, in the process at step S4, the amount of forward voltage change $\Delta Vf$ of the temperature measurement diode is calculated assuming the forward voltage Vf1 of the temperature measurement diode at the time point P1 before the MOS gate semiconductor device turns ON is 0V.

Next, the ON voltage Von of the MOS gate semiconductor device before correction depicted in FIG. 5 and obtained by step S2 is corrected to an ON voltage (hereinafter, ON voltage after correction) Von' of the MOS gate semiconductor device for the amount of temperature change $\Delta Tj$ obtained by step S4 (step S5: fifth process). In the process at step S5, measurement variation of the ON voltage Von due to self-generated heat of the MOS gate semiconductor device is removed from the variation 1 of the measurement points of the ON voltage Von before correction depicted in FIG. 5 and the variation 2 of data points of the ON voltage Von' of the MOS gate semiconductor device after correction and depicted in FIG. 6 is obtained.

Figure 7:
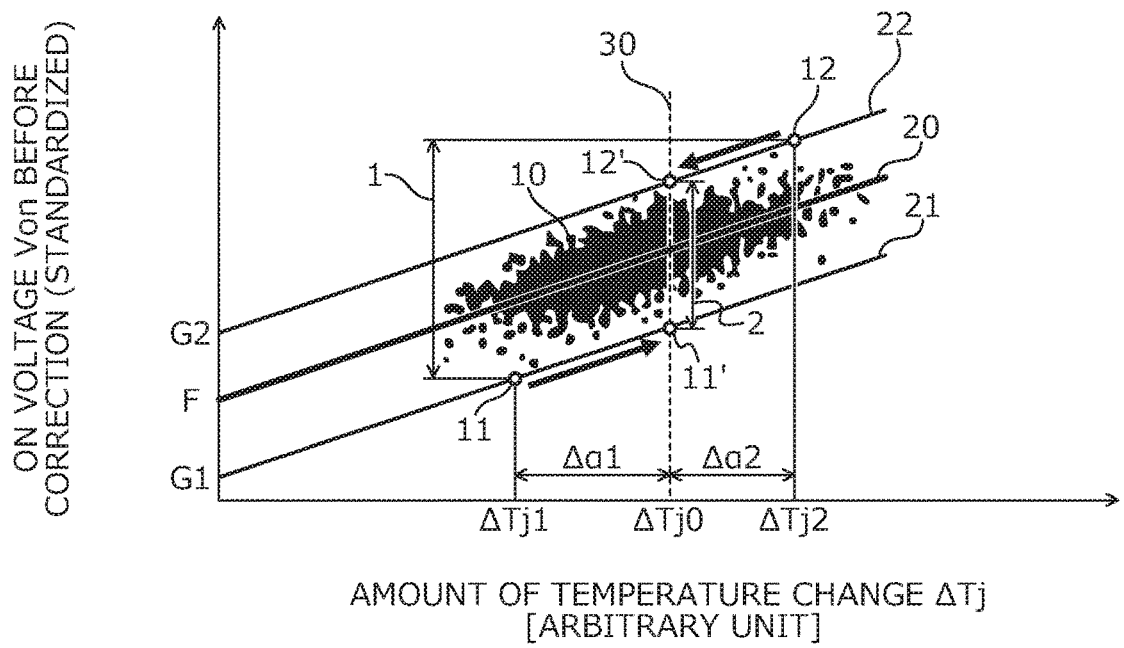
FIG. 7 is a diagram of a method of correcting the ON voltage of the semiconductor device according to the first embodiment.
Figure 8:
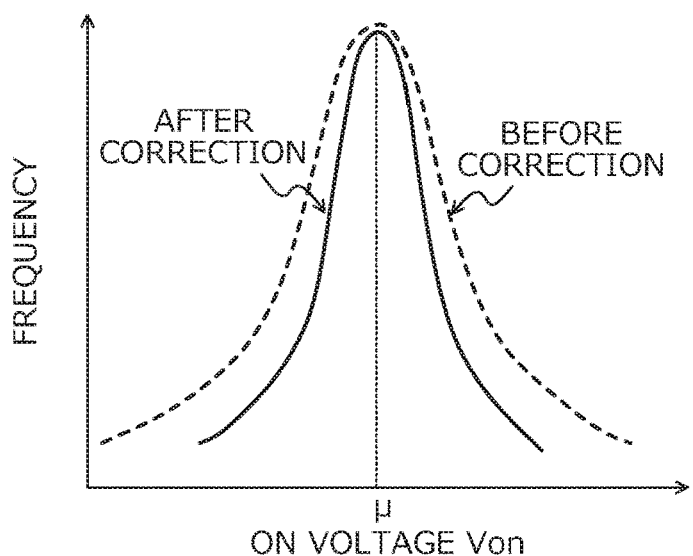
FIG. 8 is a characteristics diagram depicting normal distribution of the ON voltage of the semiconductor device according to the first embodiment before correction and after correction.

A method of correcting the ON voltage Von of the MOS gate semiconductor device before correction in the process at step S5 will be described with reference to FIG. 7. FIG. 7 is a diagram of a method of correcting the ON voltage of the semiconductor device according to the first embodiment. In FIG. 7, a horizontal axis and a vertical axis are similar to the horizontal axis and the vertical axis in FIG. 5. FIG. 7 depicts the approximate line 20 that represents dependence for the measurement point group 10 of the ON voltage Von of the MOS gate semiconductor device before correction and the amount of temperature change ΔTj for the ON voltage Von in FIG. 5. FIG. 8 is a characteristics diagram depicting normal distribution of the ON voltage of the semiconductor device according to the first embodiment before correction and after correction.

Here, a case will be described in which the amount of temperature change ΔTj obtained by step S4 is "ΔTj=9" in FIGS. 5 and 6, and "ΔTj=ΔTj0" in FIG. 7. All measurement points of the measurement point group 10 depicted in FIG. 5 are moved to be on "ΔTj=9" based on the approximate line 20 that represents dependence on the amount of temperature change ΔTj of the ON voltage Von of the MOS gate semiconductor device before correction, so that in the process at step S5, the amount of temperature change ΔTj of all measurement points of the measurement point group 10 depicted in FIG. 5 becomes the amount of temperature change ΔTj (i.e., "ΔTj=9") obtained by step S4.

In this manner, all measurement points of the measurement point group 10 are moved, whereby as depicted in FIG. 6, a set (hereinafter, data point group) 10' of data points for the predetermined amount of temperature change ΔTj obtained by step S4 is obtained. The data point group 10' is a set of data points having the ON voltage Von' of the MOS gate semiconductor device after correction and the predetermined amount of temperature change ΔTj obtained by step S4 as variables, and having measurement variation of the ON voltage caused by the amount of temperature change ΔTj1 (refer to FIG. 7) of the semiconductor chip 101 due to self-generated heat of the MOS gate semiconductor device removed. The variation 2 of data points of the data point group 10' is smaller than the variation 1 of the measurement points of the ON voltage Von of the MOS gate semiconductor device before correction depicted in FIG. 5.

For example, in the example depicted in FIG. 6, the magnitude (standard deviation) σ of the variation 2 of data points of the data point group 10', for example, may be improved to about 0.0084. For example, in ±3σ conversion that is an index of characteristics variation of the semiconductor as a manufactured product, the variation 1 of the measurement points of the ON voltage Von of the MOS gate semiconductor device before correction is an average value about μ±4% whereas the variation 2 of the data points of the ON voltage Von' of the MOS gate semiconductor device after correction is an average value about μ±2.5% and thus, may be about 1.5% smaller than the variation 1 of the measurement points of the ON voltage Von before correction (refer to FIG. 8).

More specifically, in the process at step S5, as depicted in FIG. 7, first, with respect to a predetermined measurement point 11 of the measurement point group 10, a straight line (auxiliary straight line) 21 passing through the measurement point 11 and parallel to the approximate line 20 is obtained. The auxiliary straight line 21 is a straight line used for removing effects of the amount of temperature change ΔTj1 from the ON voltage Von of the measurement point 11 and has the same slope E of the approximate line 20 and an intercept G1 different from that of the approximate line 20. Further, the measurement point 11 is moved to an intersection point between a straight line (hereinafter, reference line) 30 that is ΔTj=ΔTj0 and the auxiliary straight line 21.

In other words, as indicated by equation (4), an amount of ON voltage change due to the amount of temperature change due to a difference Δα1 (=Tj0−Tj1) of an amount of temperature change ΔTj1 of the measurement point 11 and the amount of temperature change ΔTj0 obtained by step S4 is added to the ON voltage Von before correction, whereby a data point 11' on the intersection point between the reference line 30 and the auxiliary straight line 21 is obtained. The data point 11' is a data point indicating the ON voltage Von' after correction by removing the measurement variation of the ON voltage caused by the amount of temperature change ΔTj1 of the semiconductor chip 101 due to self-generated heat of the MOS gate semiconductor device and is a data point indicating ON voltage characteristics for the predetermined amount of temperature change ΔTj0 obtained by step S4.

$$Von' = Von + E \times \Delta\alpha 1 \quad (4)$$

Furthermore, for other measurement points of the measurement point group 10 as well, similarly to the measurement point 11, the amount of ON voltage change due to the amount of temperature change due to a difference of the amount of temperature change ΔTj of each of the measurement points and the amount of temperature change ΔTj0 obtained by step S4 is added to the ON voltage Von before correction, whereby the ON voltage Von' after correction is obtained. In FIG. 7, of all the measurement points of the measurement point group 10, reference numerals 11, 12 are appended to only two measurement points separated farthest from the approximate line 20, on a lower side and an upper side of the vertical axis, and these measurement points 11, 12 are depicted in a state of being moved to the intersection points between the reference line 30 and the auxiliary straight lines 21, 22, respectively.

For a measurement point (for example, the measurement point 12) further on the right side than is the reference line 30, a difference Δα2 (=Tj0−Tj2) of the amount of temperature change ΔTj2 for the measurement point 12 and the amount of temperature change ΔTj0 obtained by step S4 is a negative number. Therefore, the ON voltage Von' after correction calculated based on equation (4) is smaller than the ON voltage Von before correction. Reference character G2 is an intercept of the auxiliary straight line 22 of the measurement point 12 having the same slope E as the approximate line 20. Reference numeral 12' is a data point obtained by moving the measurement point 12 to be positioned at an intersection point between the reference line 30 and the auxiliary straight line 22.

In this manner, in the process at step S5, all the measurement points of the measurement point group 10 are data points on the reference line 30 and the data point group 10' is obtained for the predetermined amount of temperature change ΔTj0 obtained by step S4. Thus, normal distribution (refer to FIG. 8) of the ON voltage Von' of the MOS gate semiconductor device after correction from which effects due to variation of thermal contact resistance between the back electrode of the semiconductor chip 101 and the stage 102 of the testing apparatus 110' are removed may be obtained. As a result, measurement accuracy of the ON voltage of the MOS gate semiconductor device may be enhanced.

As described above, according to the first embodiment, the first relational expression of the temperature of the semiconductor device and the forward voltage of the temperature measurement diode is obtained in advance. The second relational expression that expresses a relationship between the ON voltage of the semiconductor device and the amount of temperature change from a time point before the semiconductor device turns ON to a time point after the semiconductor device turns OFF is obtained in advance. The amount of temperature change from the time point before the semiconductor device turns ON to the time point after the semiconductor device turns OFF is obtained based on the first relational expression and the amount of forward voltage change of the temperature measurement diode during temperature measurement of the semiconductor device. Correction of the ON voltage of the semiconductor device for the amount of temperature change of the semiconductor device is performed using the second relational expression, whereby the measurement accuracy of the ON voltage characteristics of the semiconductor device may be enhanced.

Figure 9A:
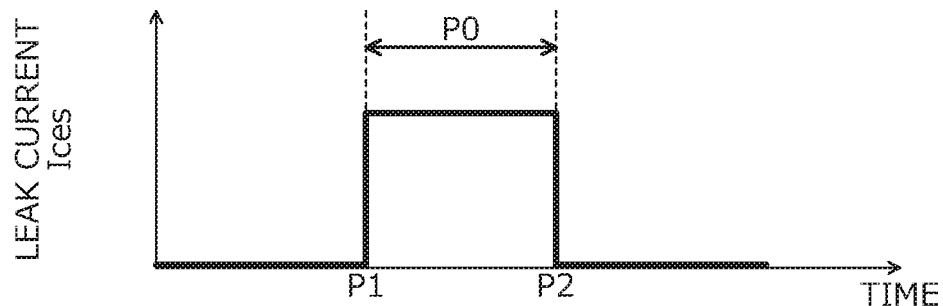
FIG. 9A is a characteristics diagram depicting temporal changes of leak current of the semiconductor device according to a second embodiment.
Figure 9B:
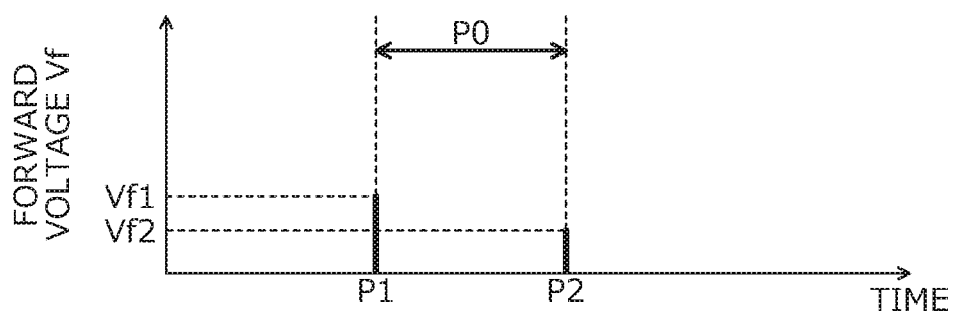
FIG. 9B is a characteristics diagram depicting temporal changes of the forward voltage of the temperature measurement diode.
Figure 9C:
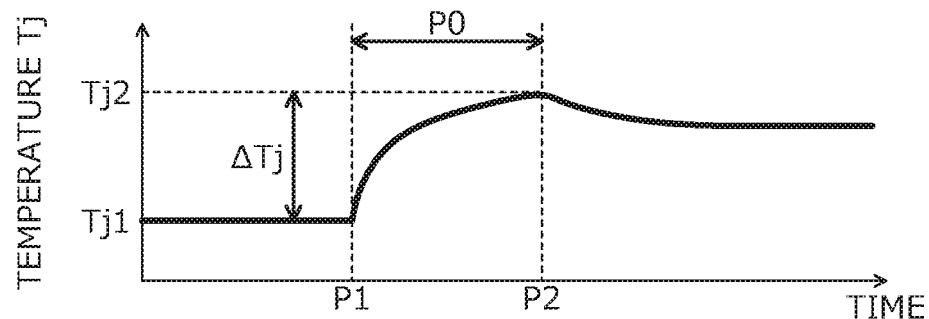
FIG. 9C is a characteristics diagram depicting temporal changes of temperature of the semiconductor device according to the second embodiment.

The method of testing a semiconductor device according to a second embodiment will be described. FIGS. 9A and 9C are characteristics diagrams depicting temporal changes of leak current and temperature of the semiconductor device according to the second embodiment. FIGS. 9A, 9B, and 9C depict temporal changes of leak current Ices of the semiconductor device of the second embodiment (FIG. 9A), temporal changes of the forward voltage Vf of the temperature measurement diode (FIG. 9B), and temporal changes of the temperature Tj of the semiconductor device of the second embodiment (FIG. 9C).

Figure 10:
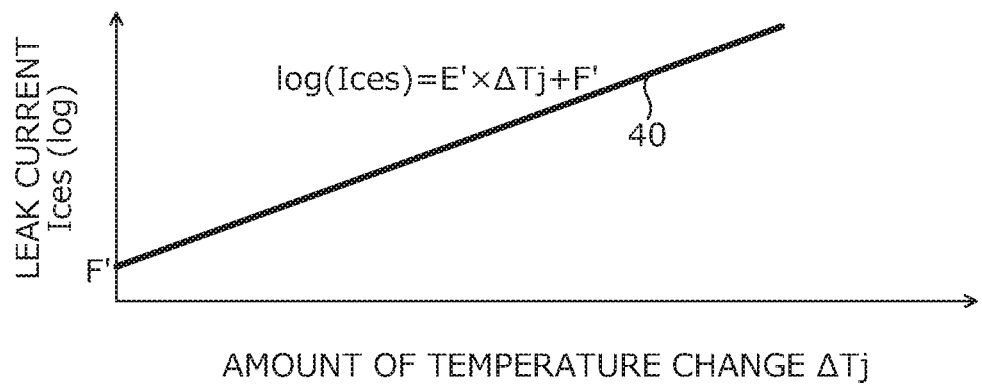
FIG. 10 is a characteristics diagram depicting temperature change dependence of the leak current of the semiconductor device of the second embodiment before correction.
Figure 11:
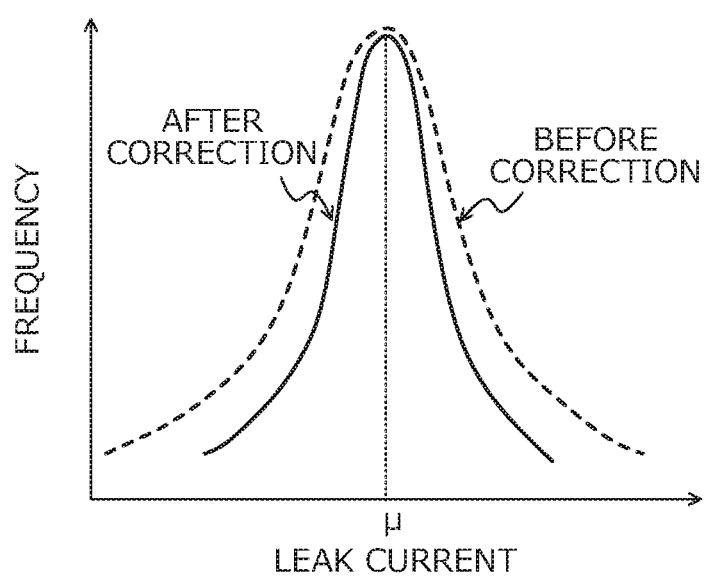
FIG. 11 is a characteristics diagram depicting normal distribution of the leak current of the semiconductor device of the second embodiment before and after correction.

FIG. 10 is a characteristics diagram depicting temperature change dependence of leak current of the semiconductor device of the second embodiment before correction. In FIG. 10, a horizontal axis and a vertical axis are the amount of temperature change $\Delta Tj$ of the semiconductor device according to the first embodiment and the leak current Ices before correction, respectively. FIG. 10 depicts measured values of the leak current Ices of the semiconductor device of the second embodiment. FIG. 11 is a characteristics diagram depicting normal distribution of leak current of the semiconductor device of the second embodiment before and after correction.

The method of testing a semiconductor device according to the second embodiment differs from the method of testing a semiconductor device according to the first embodiment in that instead of correcting the temperature change dependence of the ON voltage Von, the temperature change dependence of the leak current Ices (first physical quantity) is corrected. Here, while a case in which the semiconductor device of the second embodiment is the MOS gate semiconductor device, similarly to the first embodiment, the semiconductor device of the second embodiment may be a diode.

The leak current Ices of the MOS gate semiconductor device, similarly to the ON voltage Von, is dependent on the temperature Tj of the MOS gate semiconductor device. Therefore, in the method of testing a semiconductor device according to the second embodiment, similarly to the method of testing a semiconductor device according to the first embodiment (refer to FIG. 1), equation (1) or equation (2) above is obtained by the process at step S1 (refer to FIG. 3 or FIG. 4). Here, a case in which equation (1) is used will be described as an example.

Next, in the process at step S2, a relational expression between the leak current Ices of the MOS gate semiconductor device and the amount of temperature change $\Delta Tj$ is obtained in advance. In particular, the leak current Ices of the MOS gate semiconductor device is measured, and the temperature Tj1 before the MOS gate semiconductor device turns ON and the temperature Tj2 after the MOS gate semiconductor device turns OFF are each measured by the temperature measurement diode plural times from which the amount of temperature change $\Delta Tj$ (=Tj2−Tj1) is calculated plural times.

Measurement points having, as variables, the leak current Ices of the MOS gate semiconductor device and the amount of temperature change $\Delta Tj$ obtained in this manner are obtained and using a set (measurement point group) of all the obtained measurement points, for example, an approximate line 40 having, as two variables, a logarithm of the leak current Ices of the MOS gate semiconductor device and the amount of temperature change $\Delta Tj$ is calculated by a method of least-squares (FIG. 10). In FIG. 10, the measurement points obtained by the process at step S2 are not depicted.

The approximate line 40 is a linear function expressed by equation (5) having, as variables, the amount of temperature change $\Delta Tj$ and the leak current Ices of the MOS gate semiconductor device before correction, where E' is the slope and F' is the intercept. Attached to the approximate line 40, in characteristics variation of the leak current Ices of the MOS gate semiconductor device as a manufactured product, is measurement variation (hereinafter, measurement variation of the leak current Ices due to self-generated heat of the MOS state semiconductor device) of the leak current Ices caused by the amount of temperature change $\Delta Tj$ of the semiconductor chip 101 due to the self-generated heat of the MOS gate semiconductor device.

$$\log(Ices) = E' \times \Delta Tj + F' \quad (5)$$

The processes up to here, similarly to the first embodiment, are preparation processes for obtaining information used at a subsequent process.

In a case in which the semiconductor device of the second embodiment is a diode, the approximate line 40 is a linear function having, as variables, the amount of temperature change $\Delta Tj$ and forward current Ir of the semiconductor device of the second embodiment (diode). In FIG. 10, the amount of temperature change $\Delta Tj$ of the MOS gate semiconductor device on a horizontal axis, similarly to the first embodiment, may be an amount of change of another physical quantity that changes dependent on the temperature Tj of the MOS gate semiconductor device.

Next, similarly to the first embodiment, in the process at step S3, the amount of forward voltage change $\Delta Vf$ of the temperature measurement diode is obtained by measuring the forward voltages Vf1, Vf2 of the temperature measurement diode (FIG. 9B) at the time points P1, P2 before turn ON and after turn OFF of the MOS gate semiconductor device subject to measurement. Further, similarly to the first embodiment, the process at step S4 is performed and the amount of temperature change $\Delta Tj$ from the time point P1 before the MOS gate semiconductor device turns ON to the time point P2 after the MOS gate semiconductor device turns OFF is calculated from the amount of forward voltage change $\Delta Vf$ of the temperature measurement diode.

A schematic diagram of temporal changes of the leak current Ices of the MOS gate semiconductor device during the process at step S3 is depicted in FIG. 9A. Leak current characteristics of the MOS gate semiconductor device depicted in FIG. 9A are leak current characteristics obtained at step S5 described hereinafter and are represented as a schematic of leak current characteristics from which measurement variation of the leak current Ices due to self-generated heat of the MOS state semiconductor device has been removed. Characteristics diagrams in FIGS. 9B and 9C are identical to the characteristics diagrams in FIGS. 2B and 2C.

Next, similarly to the first embodiment, the process at step S5 is performed, the leak current Ices of the MOS gate semiconductor device before correction, obtained by step S2 and depicted in FIG. 10 is corrected to leak current Ice' of the MOS gate semiconductor device after correction by the amount of temperature change ΔTj obtained by step S4. Correction of the leak current Ices of the MOS gate semiconductor device, similarly to the first embodiment, may be obtained by using an auxiliary straight line parallel to the approximate line 40 and obtaining data points of the leak current Ices after correction by moving all the measurement points onto a reference line that is a reference for the amount of temperature change ΔTj obtained by step S4.

As a result, in the second embodiment as well, similarly to the first embodiment, variation of data points of the leak current Ices of the MOS gate semiconductor device after correction may be made smaller than variation of the measurement points of the leak current Ices of the MOS gate semiconductor device before correction (refer to FIG. 11).

As described above, according to the second embodiment, even in a case in which measurement variation of leak current caused by the amount of temperature change of the semiconductor chip due to self-generated heat of the MOS gate semiconductor device is corrected, effects similar to those of the first embodiment may be obtained.

In the foregoing, the present invention is not limited to the embodiments described above and various modifications within a range not departing from the spirit of the invention are possible. For example, in the embodiments described above, while testing of the semiconductor device is performed according to levels of the semiconductor chip, before the process of dicing (cutting) the semiconductor wafer into individual chips, the present invention may be applied and semiconductor device testing may be performed in a semiconductor wafer state. By applying the present invention and performing the semiconductor device testing in the semiconductor wafer state, measurement variation within the semiconductor wafer may be suppressed.

The method of testing a semiconductor device according to the present invention achieves an effect in that measurement accuracy of electrical characteristics (ON voltage characteristics, leak current characteristics) of the semiconductor device may be enhanced.

In this manner, the method of testing a semiconductor device according to the present invention is useful for semiconductor device in which the chip size is small and temperature increase is large due to the flow or large current.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of testing a semiconductor device by applying voltage to or passing current through the semiconductor device under predetermined conditions to measure a first physical quantity, the method comprising:
   in a first process, obtaining a first relational expression representing a relationship between a temperature of the semiconductor device and a second physical quantity different from the first physical quantity, the temperature of the semiconductor device being measured using temperature characteristics of a diode, the second physical quantity changing dependent on the temperature of the semiconductor device;
   in a second process, obtaining a second relational expression representing a relationship between the first physical quantity of the semiconductor device and an amount of change of the temperature of the semiconductor device, among a plurality of measurement points, each of which has a first variable value and a second variable value, the first variable value being a measured value of the first physical quantity that changes dependent on the temperature of the semiconductor device in a measurement period, the second variable value being measured by the diode as an amount of change of the temperature during a switching period within the measurement period of the first physical quantity, the switching period starting when the semiconductor device is turned ON and ending when the semiconductor device is turned OFF;
   in a third process, obtaining an amount of change of the second physical quantity during the switching period by measuring the second physical quantity simultaneously with the semiconductor device being turned OFF or immediately after the semiconductor device being turned OFF after the switching period;
   in a fourth process, obtaining, based on the first relational expression and the amount of change of the second physical quantity obtained in the third process, the amount of change of the temperature of the semiconductor device during the switching period; and
   in a fifth process, obtaining, based on the second relational expression, a corrected first physical quantity by correcting the first physical quantity according to the amount of change of the temperature of the semiconductor device obtained in the fourth process.

2. The method according to claim 1, wherein in the third process, the amount of change of the second physical quantity during the switching period is obtained as an amount of change from a pre-second physical quantity to a post-second physical quantity, the pre-second physical quantity being obtained before the semiconductor device is turned ON before the switching period, the post-second physical quantity being obtained simultaneously with or immediately after the semiconductor device is turned OFF after the switching period.

3. The method according to claim 1, wherein
   the second relational expression is a primary approximate line calculated by approximating all of the plurality of measurement points on a single straight line, and
   in the fifth process, a first variable value of a data point on an auxiliary straight line that is parallel to the primary approximate line and passes through a predetermined point among the plurality of measurement points is obtained as the corrected first physical quantity and corresponds to the amount of change of the temperature of the semiconductor device obtained in the fourth process.

4. The method according to claim 1, wherein
   a testing apparatus is used for the testing the semiconductor device that is formed on a first main surface of a semiconductor substrate, the testing apparatus including:
   a stage on which the semiconductor substrate is placed; and
   a metal contact that, in a state where a second main surface opposite to the first main surface of the semiconductor substrate is in contact with the stage, applies voltage to or passes current through the semiconductor device, from the first main surface under the predetermined conditions.

5. The method according to claim 4, wherein the semiconductor device and the diode are formed on the semiconductor substrate.

6. The method according to claim 1, wherein
the semiconductor device is an insulated gate bipolar transistor, and
the diode is a parasitic diode formed by a pn junction between a collector region and a drift region of the insulated gate bipolar transistor.

7. The method according to claim 1, wherein the diode is constituted by a part of the semiconductor device.

8. The method according to claim 1, wherein the second physical quantity is a forward voltage of the diode.

9. The method according to claim 1, wherein
the semiconductor device is an insulated gate semiconductor device including an insulated gate formed by a three-layer structure including a metal, an oxide film, and a semiconductor material, and
the second physical quantity is a gate threshold voltage of the semiconductor device.

10. The method according to claim 1, wherein the first physical quantity is a voltage when the semiconductor device is turned ON.

11. The method according to claim 1, wherein the first physical quantity is a leak current that flows through the semiconductor device when the semiconductor device is turned ON.

* * * * *